(12) United States Patent
Nakajima

(10) Patent No.: US 7,911,050 B2
(45) Date of Patent: Mar. 22, 2011

(54) SEMICONDUCTOR DEVICE AND METHOD FOR MANUFACTURING THE SAME

(75) Inventor: Keiichi Nakajima, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 4 days.

(21) Appl. No.: 12/078,937

(22) Filed: Apr. 8, 2008

(65) Prior Publication Data

US 2008/0258290 A1 Oct. 23, 2008

(30) Foreign Application Priority Data

Apr. 19, 2007 (JP) ................................ 2007-110177

(51) Int. Cl.
*H01L 23/34* (2006.01)
(52) U.S. Cl. .................. 257/712; 257/713; 257/717
(58) Field of Classification Search ........... 257/712, 257/713, 717
See application file for complete search history.

(56) References Cited

U.S. PATENT DOCUMENTS

| | | | |
|---|---|---|---|
| 5,424,251 A * | 6/1995 | Sono et al. | 438/127 |
| 5,763,940 A * | 6/1998 | Shibusawa et al. | 257/668 |
| 6,674,155 B2 * | 1/2004 | Nakahara et al. | 257/668 |
| 6,908,790 B2 * | 6/2005 | Nakahara et al. | 438/108 |
| 7,339,262 B2 * | 3/2008 | Son et al. | 257/671 |
| 2005/0277231 A1 * | 12/2005 | Hembree et al. | 438/127 |

FOREIGN PATENT DOCUMENTS

| | | |
|---|---|---|
| JP | 06-140538 | 5/1994 |
| JP | 6-310621 | 11/1994 |
| JP | 8-279533 | 10/1996 |
| JP | 8-279567 | 10/1996 |
| JP | 10-125834 | 5/1998 |
| JP | 2003-303928 | 10/2003 |
| JP | 2005-276943 | 10/2005 |
| JP | 2006-64939 | 3/2006 |
| JP | 2006-108356 | 4/2006 |

OTHER PUBLICATIONS

A machine translation of Japanese Patent Application Publication No. 10-125834 A has been provided and is attached.*
Chinese Action dated Jun. 25, 2010 (with an English language translation).

* cited by examiner

*Primary Examiner* — Zandra Smith
*Assistant Examiner* — Paul E Patton
(74) *Attorney, Agent, or Firm* — McGinn IP Law Group, PLLC

(57) ABSTRACT

A COF which can effectively dissipate the heat by using a simple structure and its manufacturing method. A semiconductor device of COF, which is formed over the main surface of a flexible substrate having no device hole and where a semiconductor chip is mounted over the inner lead interconnection, is characterized by forming a first resin layer over the second main surface of the flexible substrate opposite the side where the semiconductor chip is mounted and at the position corresponding to the semiconductor chip.

4 Claims, 5 Drawing Sheets

SEMICONDUCTOR DEVICE AND METHOD FOR MANUFACTURING THE SAME

FIELD OF THE INVENTION

The present invention relates to a structure of a semiconductor device for driving a flat panel display and a manufacturing method thereof and, specifically, relates to a structure of a COF (Chip On Film) and a manufacturing method thereof.

BACKGROUND OF THE INVENTION

In a flat panel display, notably a liquid crystal display and a plasma display, one where a semiconductor chip is mounted over a circuit substrate having flexibility (a flexible substrate; hereinafter, it is called a base film) has been widely used for a semiconductor device for driving them.

In general, as a semiconductor device for driving which achieves a high density for packaging semiconductor chips, there is a TCP (Tape Carrier Package) and, in particular, one where there is no device hole and where an inner lead connected with a bump electrode over the semiconductor chip makes contact with the base film, which is the substrate, is a COF (Chip On Film: hereinafter, it is called COF). On the other hand, a TCP in a narrow sense is used as a word to distinguish itself from a COF, in which there is a device hole formed by cutting the tape substrate and there is a connection between the inner lead existing at the device hole (it is called a flying lead) and the terminal of the semiconductor chip. Hereinafter, when it is only called TCP, it means this TCP in a narrow sense.

Since the COF has the aforementioned structure, it is different from the TCP and has no flying lead which is easily bent; it can make the lead thinner; it has features where the etching characteristics of the circuit interconnection layer is improved and a fine pitch process is easily applied. Therefore, in recent years this COF has been mainstream.

On the other hand, in a flat panel display for a wide screen television set, there is a concern that the reliability of the semiconductor device is impaired by heat produced from the semiconductor device for driving and that the display quality is impaired by propagation of the heat to the flat panel display.

Conventionally, as a means for heat dissipation of this COF, JP-A-2006-108356 and JP-A-2006-64939 disclose a technology where a metallic heat radiating body and heat radiating tape are attached over the rear surface of the base film.

Moreover, although it is not a COF, a conventional heat dissipation means will be described for reference purposes. As a technology for contacting a cooling material directly with the rear surface of the semiconductor chip, JP-A-2003-303928 discloses a technology where the rear surface of a semiconductor ship is covered with paint and a tape, and JP-A-Hei06 (1994)-310621 discloses a technology where a cooling body is attached over the rear surface of a semiconductor chip.

Next, there is a technology related to a change of the material and the structure of a surface protection film of a semiconductor element. In JP-A-2005-276943, a technology is disclosed in which a solder-resist coated as an insulation of the conventional circuit interconnection layer is replaced by a liquid ceramic; JP-A-Hei10(1998)-125834 discloses a technology for sealing a semiconductor element by using double resins; and JP-A-Hei08 (1996)-279567 and JP-A-Hei08 (1996)-279533 disclose a technology where a semiconductor element is covered with a metallic layer having a low melting-point.

SUMMARY OF THE INVENTION

In order to reduce the cost of a semiconductor device for driving, it is required that many driving circuits are integrated in a chip. However, the aforementioned heat generation increases in proportion to the number of the driving circuits. In general, in a self-heat-producing semiconductor device, a cooling mechanism such as a cooling body is usually provided for making contact with the package, but the cost-increase caused by the cooling mechanism conflicts with the original purpose of cost-reduction.

In the aforementioned JP-A-2006-108356 to JP-A-Hei08 (1996)-279533, there is no technology that can dissipate heat inexpensively and efficiently by using a simple structure and manufacturing method.

In a semiconductor device where a semiconductor chip is mounted over a first surface of a flexible substrate which does not have a device hole, the present invention is characterized by forming a resin layer over the second surface of the flexible substrate opposite the side where the semiconductor chip is mounted and at the position corresponding to the semiconductor chip.

A manufacturing method of the present invention includes the steps for mounting a semiconductor chip over the first surface of the flexible substrate and forming a resin layer by a resin printing technique over the second surface of the flexible substrate and at the position of the semiconductor chip.

A semiconductor device of the present invention has a resin layer, not a metallic plate, over the rear surface of a COF package and the resin layer achieves heat dissipation.

A case is considered in which a production line for manufacturing TCP is switched over to a production line for manufacturing COF. Resin formation using a printing technique is typically applied to resin sealing for TCP. On the other hand, a printing technique cannot be applied to a resin sealing technique for COF and a kind of potting technique, a so-called under-fill, is generally used for it. In other words, if the production line is switched over, the equipment for resin forming using the printing technique becomes an idle facility.

The present invention therefore provides a COF which can efficiently dissipate heat by using a simple structure and manufacturing method and a manufacturing method thereof without the need for making new capital investment and by using existing facilities and components.

DETAIL DESCRIPTION OF THE PREFERRED EMBODIMENTS

Figure 1:
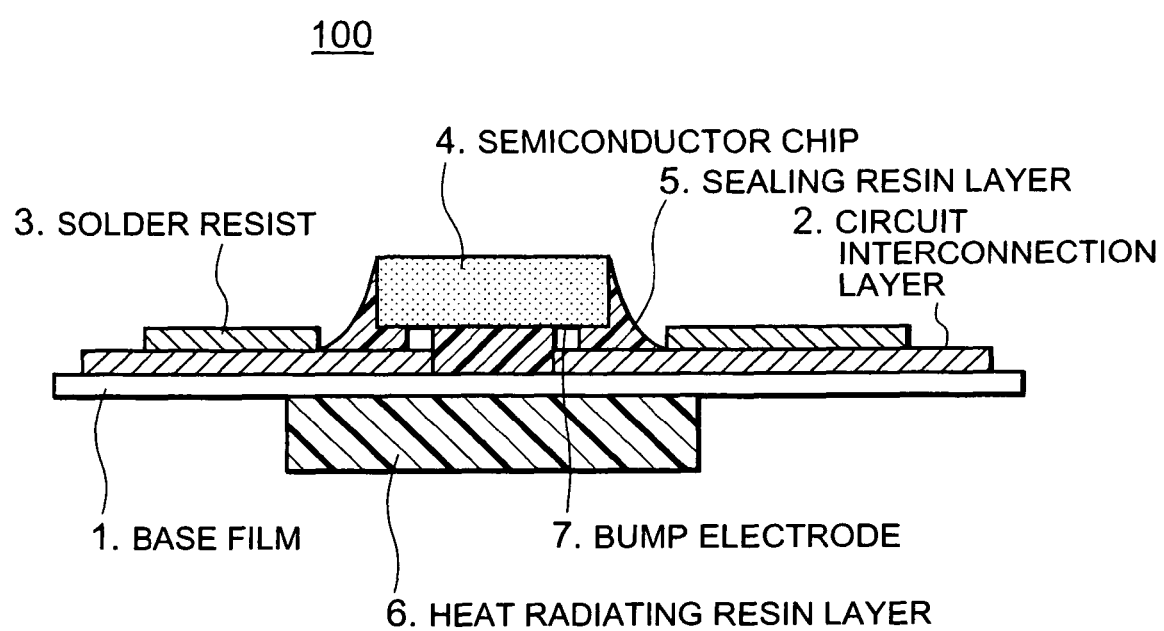
FIG. 1 is a cross-sectional view according to a first embodiment of the present invention.

Hereafter, preferred embodiments of the present invention will be described with reference to the following drawings. FIG. 1 is a cross-sectional drawing of a COF 100 related to the first embodiment of the present invention.

As shown in FIG. 1, the COF 100 of the first embodiment includes a base film 1, a circuit interconnection layer 2, a solder-resist 3, a semiconductor chip 4, a sealing resin layer 5, and a heat radiating resin layer 6.

The semiconductor chip 4 is connected over the base film 1, on which the circuit interconnection layer 2 is formed, with the surface down through a bump electrode 7. The heat radiating resin layer 6 which is the first resin layer is formed at the opposite side (rear side) of the circuit interconnection layer 2 over the base film 1. Moreover, the sealing resin layer 5 which is the second resin layer is formed between the surface of the semiconductor chip 4 and the base film 1.

The resin material of the heat radiating resin layer 6 may be the same as the resin for sealing the semiconductor chip 4 and one including filler may be acceptable when spreading the resin is difficult to control and when there is an attempt to improve the effects of heat dissipation.

Accordingly, a COF which has better heat dissipation and excellent insulation performance can be formed by providing a heat radiating layer made of a resin.

Figure 2:
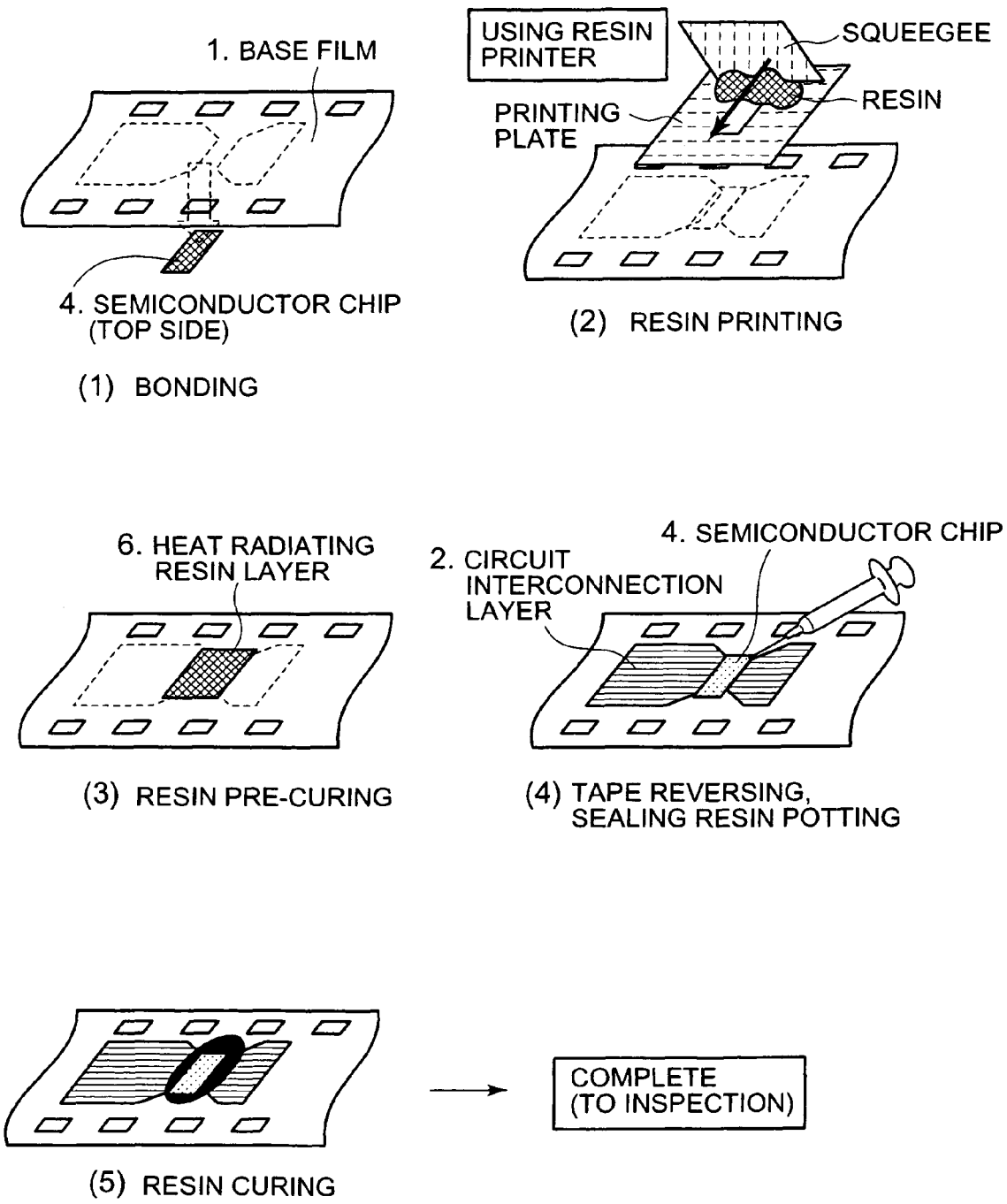
FIGS. 2(1)-(5) are manufacturing method 1 according to the present invention (the case of a TCP bonder)
Figure 3:
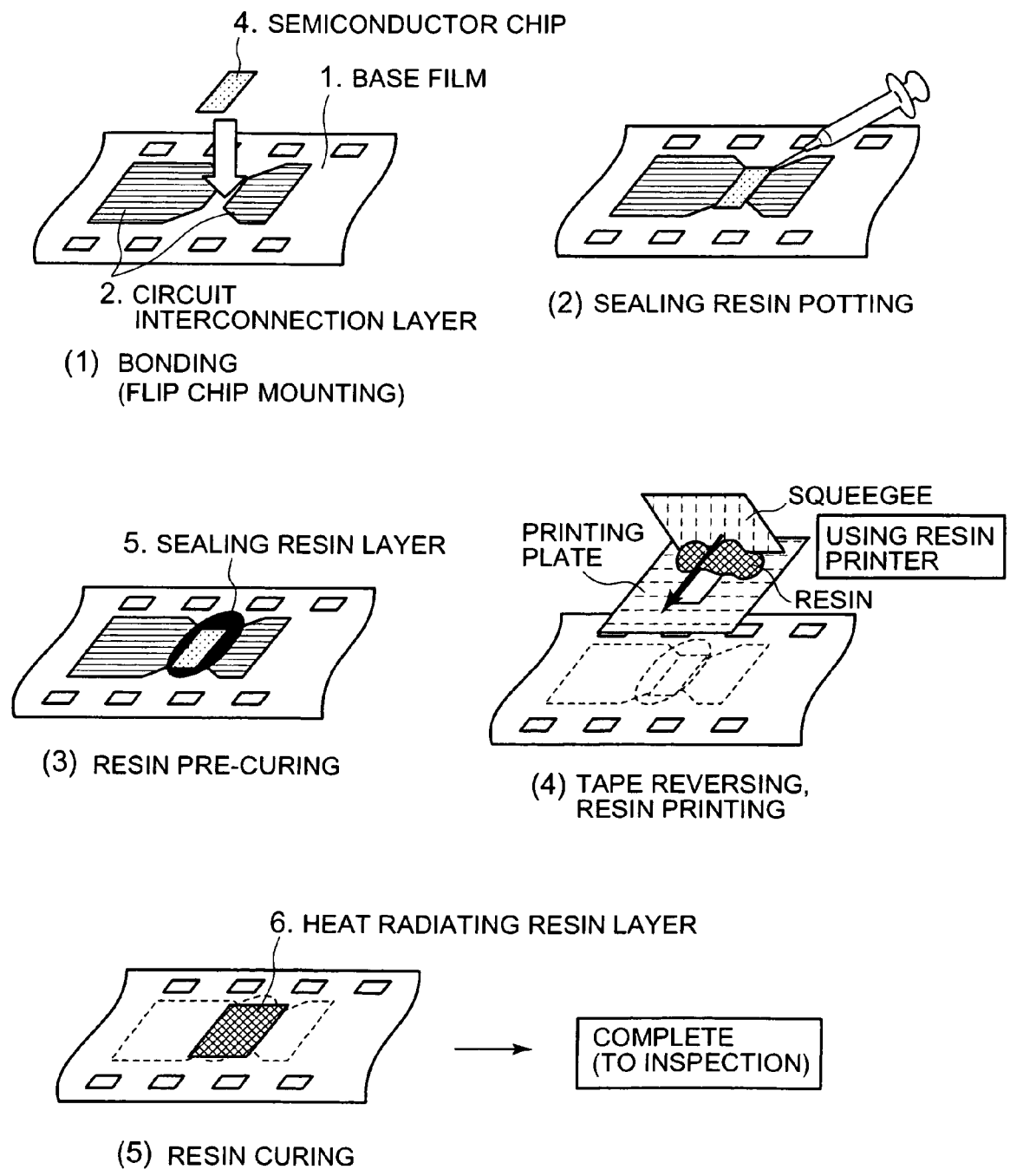
FIGS. 3(1)-(5) are manufacturing method 2 according to the present invention (the case of a COF bonder)

FIG. 2 and FIG. 3 show a method for manufacturing the COF 100 composed as above.

FIG. 2 is a case where a bonder for TCP is used and FIG. 3 is a case where a bonder for COF is used when the COF 100 of the invention is manufactured.

At first, the case for using a bonder for TCP is described in FIG. 2.

Over the circuit interconnection layer 2, except for the region where the semiconductor chip 4 is mounted and the pad, the semiconductor chip 4 is connected to a base film 1 where the solder resist 4 is formed. For instance, the connection method is one where gold at the surface of the bump electrode 7 of the semiconductor chip 4 is connected to tin at the inner lead surface of the circuit interconnection layer 2 by a gold-tin eutectic crystal (inner lead bonding).

Concretely, the semiconductor chip 4 is put on the bonding equipment with the surface facing upward; alignment is performed between the bump electrode 7 of the semiconductor chip 4 and the inner lead of the circuit interconnection layer 2 in the form of covering the base film 1 thereon with the circuit interconnection layer 2 side down; and they are connected to each other by pressing under the conditions of heat (it is not shown in the figure).

Next, the heat radiating resin layer 6 is formed by using a resin printing technique on the reverse side (rear side) of the face of the base film 1 where the semiconductor chip 4 is mounted (refer to FIG. 2 (2)). Herein, of special note is that the resin printer for performing this resin printing is used for formation of the heat radiating resin layer 6. In other words, this resin printer is used for forming the sealing resin layer 5 for a TCP and it is never used for a COF. The reason is that a part where the resin does not enter is created between the semiconductor chip 4 and the base film 1 because of the manufacturing method thereof in a COF which does not have a device hole. It is important that the heat radiating resin layer 6 is formed by effectively using the resin printer which becomes an idle facility when the TCP is switched over to the COF.

Moreover, in order to perform effective heat dissipation, it is necessary that the heat radiating resin layer 6 be formed through the base film 1 over the right rear surface of the position where the semiconductor chip 4 is mounted. Then, it is necessary to align the surface where the semiconductor chip 4 is mounted over the heat radiating resin layer 6. In general, the chips are aligned at fixed pitches in the tape carrier package and feeding the tape (base film) is performed with reference to the sprocket holes. Therefore, when the position of the first chip is determined, alignment can be easily performed accurately by using the mechanical position information from the sprocket. Moreover, it is possible to align them by using position information from the recognition hole and the pattern (transmitted light).

The resin material can be managed collectively when a silicon system or polyamide system epoxy resin similar to the sealing resin layer 5 is used.

Moreover, in order to improve the effect of heat dissipation, it is effective to use a material having insulation performance and high thermal conductivity as filler. For instance, a metallic oxide which has insulation performance such as ferrite powder and diamond powder which has high thermal conductivity may be used as filler. Moreover, if there is no problem in the insulation performance, metallic powder may be used as filler and it may be possible to mix a metallic oxide, diamond powder, and metal powder and use it as filler.

Furthermore, the larger size of the heat radiating resin layer 6 the more effective is the heat dissipation. However, the preferable size thereof is one similar to the sealing resin layer 5. When it is mounted in a flat panel display unit, the base film is bent and mounted to make the chip mounting side inside. Therefore, the bending part which has the flexibility of the base film 1 is limited by the size of the sealing resin layer 5. However, when the size of the heat radiating resin layer 6 is larger than the size of the sealing resin layer 5, the part which has the flexibility of the base film 1 is limited by the size of the heat radiating resin layer 6. In some cases, changes are created in the mechanism itself of the flat panel display unit. Therefore, the size of the heat radiating resin layer 6 is preferably controlled to be the extent of the size where the part having flexibility of the base film 1 is limited by the size of the sealing resin layer 5, that is, the size of the sealing resin layer 5.

Next, the heat radiating resin layer 6 is pre-cured by performing the heat treatment (refer to FIG. 2 (3)).

Next, the base film 1 is reversed to be arranged so that the mounting surface of the semiconductor chip 4 is facing up and the surface, where the heat radiating resin layer 6 is formed, is facing down. Afterwards, the sealing resin layer 5 is formed by potting between the semiconductor chip 4 and the base film 1 in order to protect it from humidity or pollution, etc. of the surrounding environment. For instance, an epoxy resin is used for a resin material (refer to FIG. 2 (4)).

This sealing resin layer 5 is cured by performing the heat treatment (refer to FIG. 2 (5)).

After passing the inspection process, the COF 100 is completed (refer to FIG. 1).

Next, the case where a bonder for COF is used will be described in FIG. 3.

Herein, the only difference between the manufacturing methods of a TCP bonder and a COF bonder is the order of the formation of the heat radiating resin layer 6. Therefore, as long as there is no specific description, the manufacturing method of a COF bonder is common with that of a TCP bonder, so that detailed descriptions are omitted.

The base film 1 with the circuit interconnection layer 2 facing upward is arranged over the bonding equipment and jointed to make the surface of the semiconductor chip 4 face down. Concretely, the bump electrode 7 of the semiconductor chip 4 is connected with the inner lead of the circuit interconnection layer 2 by using an inner lead bonding technique (refer to FIG. 3 (1)).

Afterwards, the sealing resin layer 5 is formed by potting between the semiconductor chip 4 and the base film 1 in order to protect it from humidity or pollution, etc. of the surrounding environment (refer to FIG. 3 (2)).

Then, this sealing resin layer 5 is pre-cured by performing the heat treatment (refer to FIG. 3 (3)).

Then, the base film 1 is reversed to make the mounting surface of the semiconductor chip 4 face down and the rear face of the mounting surface of the semiconductor chip 4 face up, and it is arranged over a resin feeder line.

And, the heat radiating resin layer 6 is formed over the rear surface of the base film 1 corresponding to the position where the semiconductor chip 4 is mounted. In this case, as in the case of a TCP bonder, the resin printer which was used for sealing the semiconductor chip 4 is used when a TCP is manufactured and the heat radiating resin layer 6 is formed by using the resin printing technique (FIG. 3 (4)).

This heat radiating resin layer 6 is cured by performing the heat treatment (refer to FIG. 3 (5)).

After passing the inspection process, the COF 100 is completed (refer to FIG. 1).

Figure 4A:
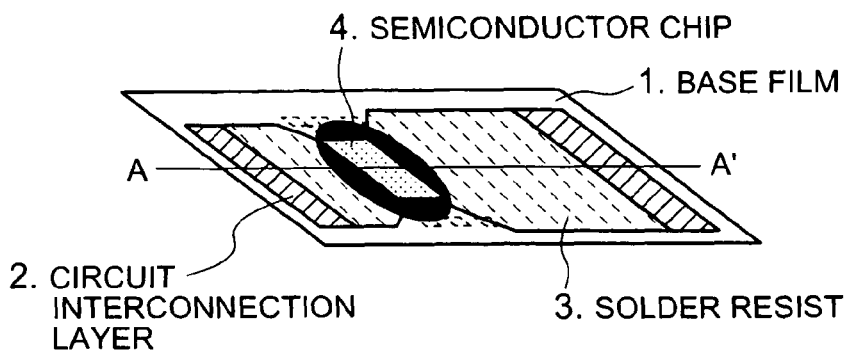
FIG. 4A is a perspective view from the semiconductor chip mount side according to a second embodiment of the present invention.
Figure 4B:
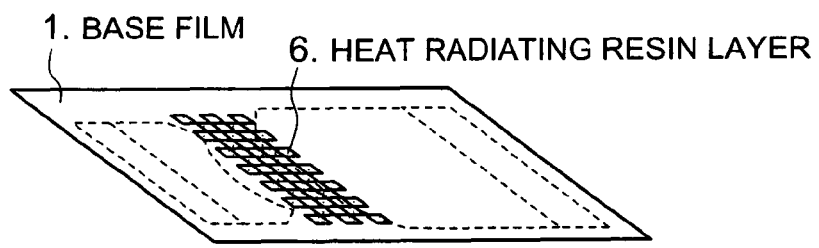
FIG. 4B is a perspective view from the reverse side according to the second embodiment of the present invention.
Figure 5:
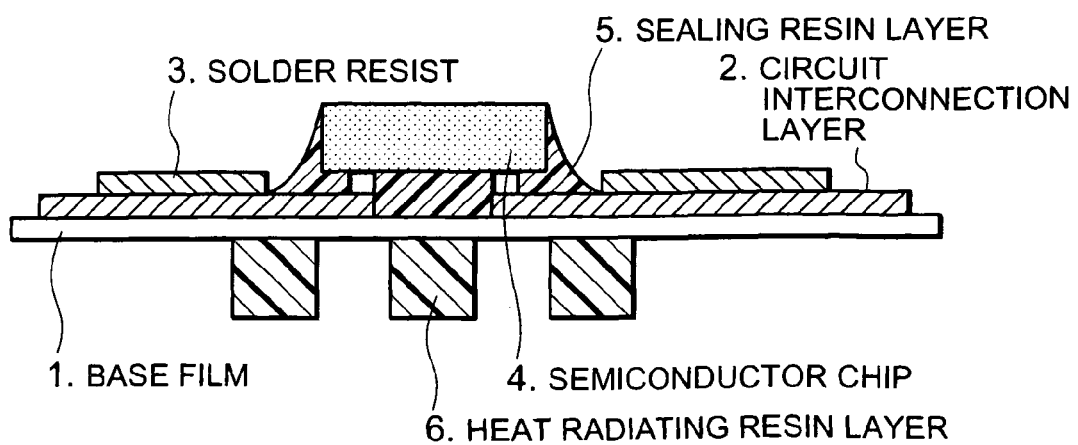
FIG. 5 is a cross-sectional view of the second embodiment of the present invention.

FIGS. 4A and 4B are perspective views illustrating the COF 100 related to the second embodiment of the invention, and FIG. 5 is a cross-sectional drawing at A-A' of FIG. 4.

The heat radiating resin layer 6 of the first embodiment has a strip shape. On the other hand, the point of the second embodiment of the invention is that the heat radiating resin layer 6 has a grid shape where diced openwork is provided in order to increase the surface area of the heat radiating resin layer 6 as shown in FIG. 4 and FIG. 5. In addition, the surface area may be increased by providing roughness such as a dimpled shape or wave shape for the surface of the heat radiating resin layer 6 when open work is not by provided. Roughness can be easily formed by using a stamp when the heat radiating resin layer 6 is pre-cured. The means is not limited to this and the heat radiating resin layer 6 may be divided into two or more.

Since the manufacturing method thereof and the material for the heat radiating resin are the same as the aforementioned first embodiment, the descriptions will be omitted.

Figure 6:
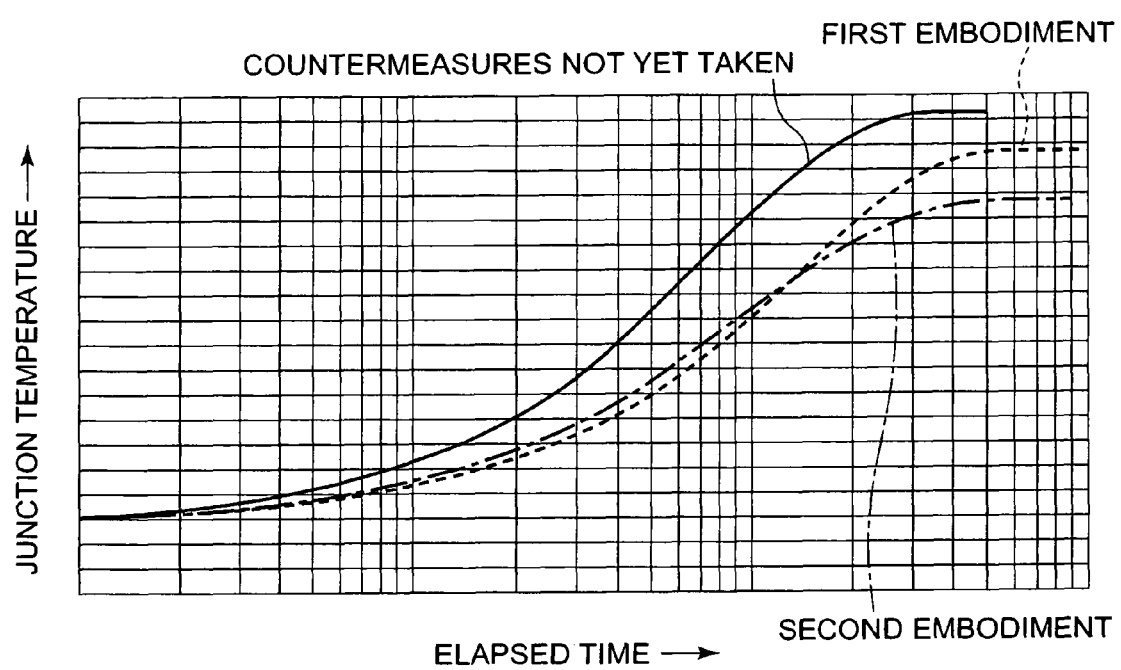
FIG. 6 is a graph showing thermal simulation results.

Finally, FIG. 6 shows the thermal simulation results. This is a comparison of the thermal simulation results between the prior art where a heat radiating resin layer is not formed over the rear surface, the first embodiment, and the second embodiment. The conditions of the thermal simulation are determined with respect to an environment where they are surrounded by air.

As shown in FIG. 6, the present invention can suppress the increase in the junction temperature compared with the prior art by forming a resin layer over the rear surface of the COF. This is due to heat dissipation being increased by arranging the heat radiating resin layer 6 over the rear surface.

Moreover, since it is clearly understood from the simulation results of FIG. 6, more effective heat dissipation becomes possible in the second embodiment compared with the first embodiment because it has a shape where the surface area is increased even if the resin thickness is the same.

Since the heat radiating resin layer 6 is formed by effectively using the resin printer which becomes an idle facility when a TCP is switched over to a COF in the present invention, existing facilities can be used as is without the need for making new capital investment.

Moreover, when more effective heat dissipation is obtained, a material having insulation performance and high thermal conductivity may be mixed in the resin as filler for the heat radiating resin layer 6. When the sealing resin layer 5 is formed, mixing filler having high thermal conductivity cannot be used because the gap between the semiconductor chip and the film is small and the filling becomes worse. However, in this invention, since a resin printer is used for forming the heat radiating resin layer 6, formation of the sealing resin layer 5 and formation of the heat radiating resin layer 6 can be done independently and easily used properly. Therefore, it has a feature in which a sealing resin material and a heat radiating resin material can be selected under optimized conditions as necessary. Moreover, in equipment where the insulation performance of the heat radiating resin layer 6 does not become a problem, it is possible to use metallic filler having high heat dissipation.

Moreover, a COF of the present invention does not use specific manufacturing facilities, so that both a conventional COF bonder and a TCP bonder can be easily manufactured.

In addition, when a sealing resin layer 5 and a heat radiating resin layer 6 are made of the same material, the material can be managed collectively.

Additionally, the heat radiating resin layer 6 is formed by using a proven resin printer for TCP, so that the adhesion between the base film and the resin is as before and does not have any problems.

Moreover, since it is not a technique as in the prior art where an insulating resin is formed over the heat radiating body made of a metal and the resin itself has both insulation performance and heat dissipation, the thickness of the semiconductor device can be made thinner.

Moreover, if a heat radiating resin layer which has almost the same size as the sealing resin layer is provided over the opposite side of the semiconductor chip mounting surface, the part which has the flexibility of the base film is not limited by the size of the heat radiating resin layer, so that no change is made in the mechanism for mounting the semiconductor device.

If the present invention is applied to a semiconductor for driving a flat panel display, it is possible to make the pitch finer and reduce the cost, and COF can be achieved in which effective heat dissipation is possible.

What is claimed is:

1. A semiconductor device, comprising:
   a semiconductor chip mounted over a first surface of a continuous flexible substrate,
   wherein a first resin layer is formed over a second surface of said continuous flexible substrate opposite a side where the semiconductor chip is mounted and at a position corresponding to said semiconductor chip,
   wherein a second resin layer is filled between said continuous flexible substrate and said semiconductor chip, and
   wherein said first resin layer comprises a divided plurality of resins or a resin which has one or more slits.

2. A semiconductor device, comprising:
   a semiconductor chip mounted over a first surface of a continuous flexible substrate,
   wherein a first resin layer is formed over a second surface of said continuous flexible substrate opposite a side where the semiconductor chip is mounted and at a position corresponding to said semiconductor chip,
   wherein a second resin layer is filled between said continuous flexible substrate and said semiconductor chip, and
   wherein said first resin layer has a surface with roughness.

3. A semiconductor device, comprising:
   a semiconductor chip mounted over a first surface of a continuous flexible substrate, wherein a first resin layer is formed over a second surface of said continuous flexible substrate opposite a side where the semiconductor chip is mounted and at a position corresponding to said semiconductor chip, wherein a second resin layer is filled between said continuous flexible substrate and said semiconductor chip, and wherein said first resin layer has substantially the same size as said second resin layer.

4. A semiconductor device, comprising:

a semiconductor chip mounted over a first surface of a continuous flexible substrate, wherein a first resin layer is formed over a second surface of said continuous flexible substrate opposite a side where the semiconductor chip is mounted and at a position corresponding to said semiconductor chip, wherein a second resin layer is filled between said continuous flexible substrate and said semiconductor chip, and wherein said first resin layer and said second resin layer include different materials have different fillers.

* * * * *